(12) United States Patent
Kageyama

(10) Patent No.: US 11,605,769 B2
(45) Date of Patent: Mar. 14, 2023

(54) LIGHT EMITTING ELEMENT AND LIGHT EMITTING DEVICE

(71) Applicant: NICHIA CORPORATION, Anan (JP)

(72) Inventor: Hiroaki Kageyama, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/378,422

(22) Filed: Jul. 16, 2021

(65) Prior Publication Data
US 2022/0029079 A1    Jan. 27, 2022

(30) Foreign Application Priority Data

Jul. 22, 2020   (JP) .............................. JP2020-125203

(51) Int. Cl.
*H01L 33/64* (2010.01)
*H01L 33/38* (2010.01)
*H01L 33/44* (2010.01)

(52) U.S. Cl.
CPC .......... *H01L 33/642* (2013.01); *H01L 33/641* (2013.01); *H01L 33/644* (2013.01); *H01L 33/382* (2013.01); *H01L 33/44* (2013.01)

(58) Field of Classification Search
CPC ....... H01L 33/382; H01L 33/44; H01L 33/62; H01L 33/641; H01L 33/642; H01L 33/644

See application file for complete search history.

(56) References Cited

U.S. PATENT DOCUMENTS

| 2015/0349232 A1* | 12/2015 | Lee ........................ H01L 29/861 257/91 |
| 2016/0351756 A1* | 12/2016 | Noichi ..................... H01L 33/38 |
| 2018/0254383 A1 | 9/2018 | Perzlmaier et al. |

FOREIGN PATENT DOCUMENTS

| JP | 2013-098515 A | 5/2013 |
| JP | 2016-012707 A | 1/2016 |
| JP | 2018-525822 A | 9/2018 |
| JP | 2019-192746 A | 10/2019 |
| WO | WO-2015/160718 A2 | 10/2015 |

* cited by examiner

*Primary Examiner* — Matthew C Landau
*Assistant Examiner* — Dmitriy Yemelyanov
(74) *Attorney, Agent, or Firm* — Foley & Lardner LLP

(57) ABSTRACT

A light emitting element includes: a semiconductor layered structure; a first electrically insulating film covering surfaces of the semiconductor layered structure and defining a first opening in each of a first region and a second region of a first semiconductor layer, and defining a second opening in a portion above a second semiconductor layer; a first electrode electrically connected to the first semiconductor layer through each first opening; a second electrode electrically connected to the second semiconductor layer through the second opening; a first terminal located on the first electrode and electrically connected to the first electrode; a second terminal located on the second electrode and electrically connected to the second electrode; and a metal member located on a portion of the first electrically insulating film located over the second semiconductor layer and electrically insulated from the first terminal and the second terminal.

17 Claims, 12 Drawing Sheets

LIGHT EMITTING ELEMENT AND LIGHT EMITTING DEVICE

CROSS-REFERENCE TO RELATED PATENT APPLICATION

The present application claims priority under 35 U. S. C. § 119 to Japanese Patent Application No. 2020-125203, filed Jul. 22, 2020, the contents of which are hereby incorporated by reference in their entirety.

BACKGROUND

The present disclosure relates to a light emitting element and a light emitting device.

JP 2016-12707A discloses a light emitting element including a semiconductor layered structure having a first semiconductor layer of a first conductivity type, an active layer, and a second semiconductor layer of a second conductivity type, a first electrode electrically connected to the first semiconductor layer, and a second electrode electrically connected to the second semiconductor layer.

SUMMARY

It is an object of certain embodiments of the present disclosure to provide a light emitting element and a light emitting device having good heat dissipation performance.

A light emitting element according to one embodiment includes: a semiconductor layered structure including a first semiconductor layer of a first conductivity type, an active layer disposed on a portion of the first semiconductor layer, and a second semiconductor layer of a second conductivity type disposed on the active layer, the first semiconductor layer including a first region and a second region, disposed adjacent to each other and exposed from the active layer and the second semiconductor layer, a first electrically insulating film covering surfaces of the semiconductor layered structure and defining a first opening in the first region and in the second region, and defining a second opening in a portion above the second semiconductor layer, a first electrode disposed on the first electrically insulating film and electrically connected to the first semiconductor layer through the first opening, a second electrode electrically connected to the second semiconductor layer through the second opening, a first terminal disposed on the first electrode and electrically connected to the first electrode, a second terminal disposed on the second electrode and electrically connected to the second electrode, and a metal member disposed on a portion of the first electrically insulating film located over the second semiconductor layer and electrically insulated from the first terminal and the second terminal, a portion of the metal member being located between the first region and the second region in a top plan view.

A light emitting device according to one embodiment includes the light emitting element described above and a base member. The base member includes a first electrically conductive member electrically connected to the first terminal, a second electrically conductive member electrically connected to the second terminal, and a third electrically conductive member electrically connected to the metal member.

A light emitting device according to another embodiment includes the light emitting element described above and a base member. The base member includes a first electrically conductive member electrically connected to the first terminal, and a second electrically conductive member electrically connected to the second terminal and to the metal member.

Using the embodiments, a light emitting and a light emitting device that have good heat dissipating properties can be provided.

DETAILED DESCRIPTION

Embodiments

Figure 1:
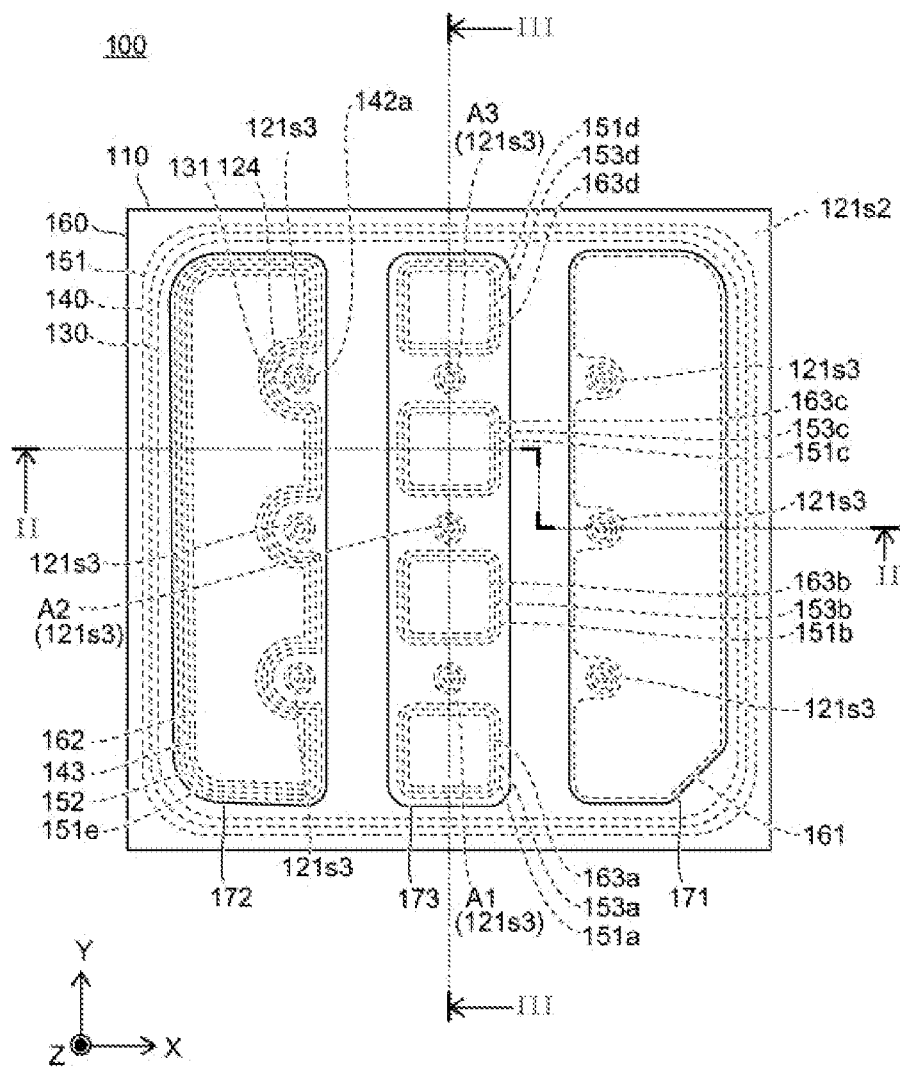
FIG. 1 is a schematic top plan view showing a light emitting element according to one embodiment.
Figure 2:
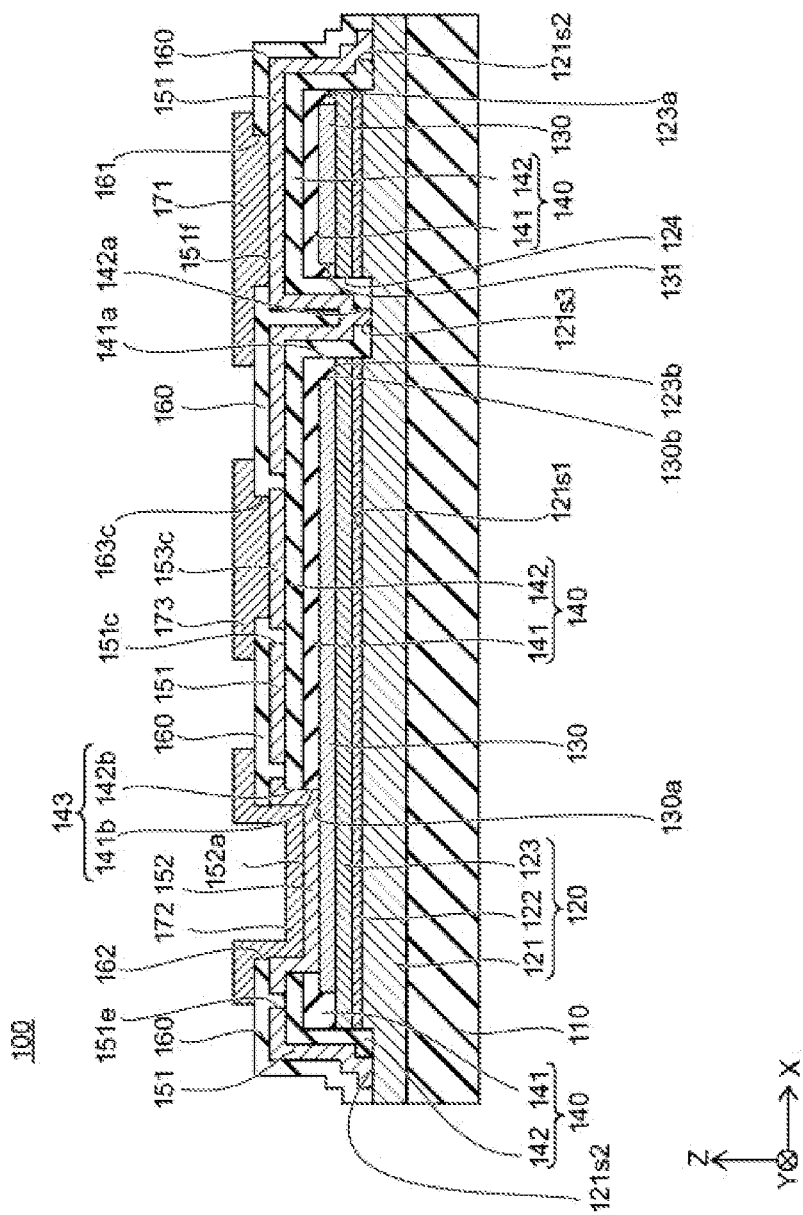
FIG. 2 is a schematic cross-sectional view taken along line II-II of FIG. 1.
Figure 3:
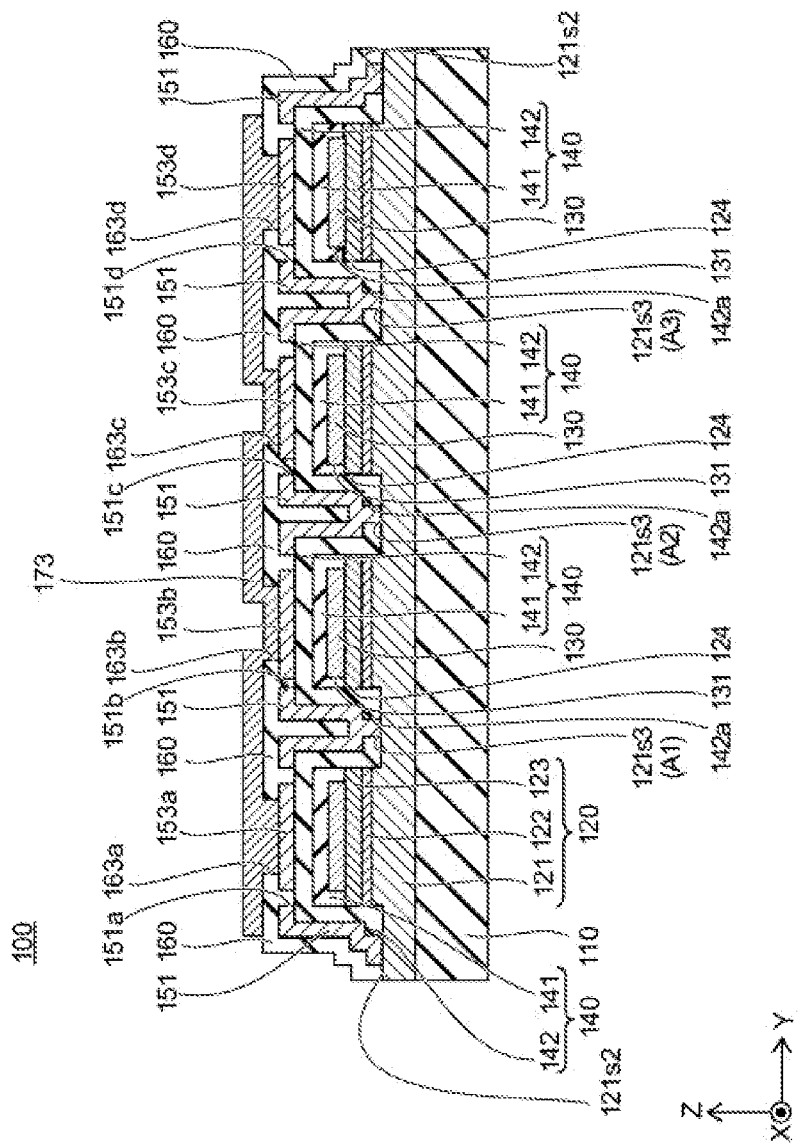
FIG. 3 is a schematic cross-sectional view taken along line of FIG. 1.

FIG. 1 is a schematic top plan view showing a light emitting element according to one embodiment. FIG. 2 is a schematic cross-sectional view taken along line II-II of FIG. 1. FIG. 3 is a schematic cross-sectional view taken along line of FIG. 1. As shown in FIG. 2 and FIG. 3, the light emitting element 100 according to the present embodiment includes a substrate 110, a semiconductor layered structure 120, a light-reflecting electrode 130, a first electrically insulating film 140, a first electrode 151, a second electrode 152, a plurality of metal layers 153a, 153b, 153c, and 153d, a second electrically insulating film 160, a first terminal 171, a second terminal 172, and a metal member 173. Each component of the light emitting element 100 will be described in detail below.

The substrate 110 is a substrate to allow epitaxial growth of a nitride semiconductor layered structure 120. The substrate 110 preferably has light-transmissive properties. For such a substrate 11, for example, a sapphire substrate or the like can be employed.

As shown in FIG. 2 and FIG. 3, the semiconductor layered structure can be provided on the substrate 110. The semiconductor layered structure 120 includes a first semiconductor layer 121 of a first conductivity type, an active layer 122 disposed on a portion of the first semiconductor layer 121, and a second semiconductor layer 123 of a second conductivity type disposed on the active layer 122.

In the description below, an XYZ orthogonal coordinate system will be adopted. A direction from the first semiconductor layer 121 toward the active layer 122 will be indicated as a "Z-direction." One direction perpendicular to the Z-direction will be indicated as an "X-direction." One direction perpendicular to the Z-direction and the X-directions will be indicated as a "Y-direction." In the description of the light emitting element 100 with reference to FIG. 1 through FIG. 9, the Z-direction will also be indicated as an "upward direction" and an opposite direction thereof will be indicated as a "downward direction," but these representations are for convenience and are independent of the gravity direction. In addition, the term "top plan view" refers to a view of an object from above, or to a view of an object from above through other members.

Figure 4:
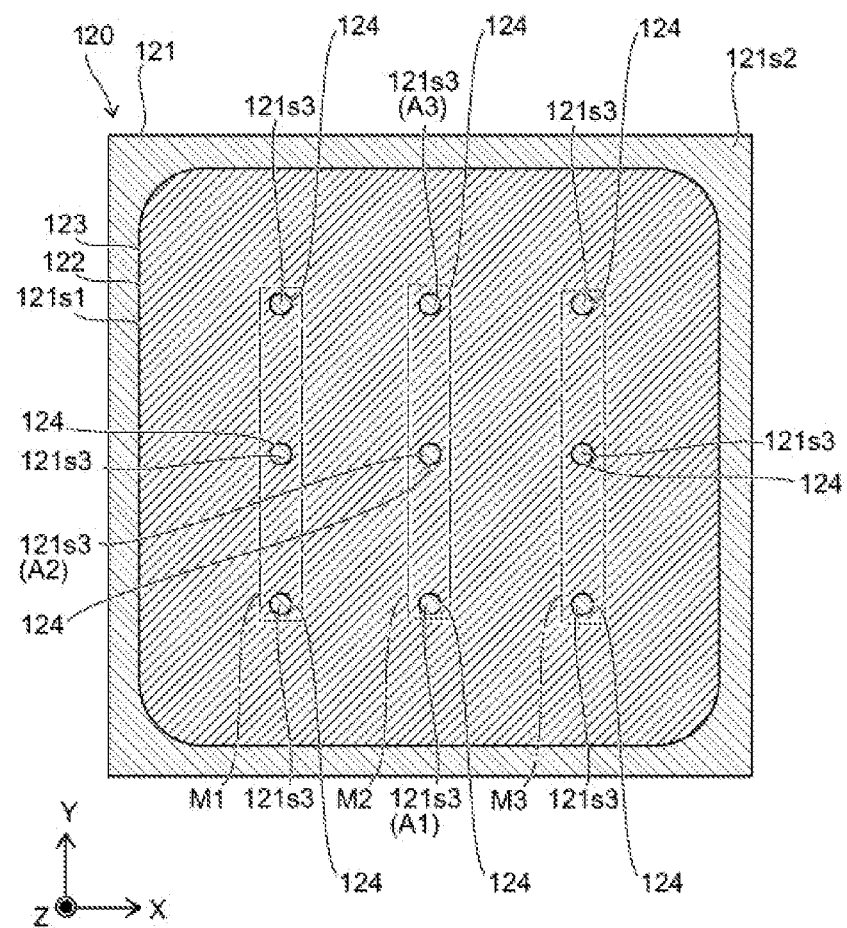
FIG. 4 is a schematic top plan view of a semiconductor layered structure of a light emitting element according to one embodiment.

FIG. 4 is a schematic top plan view of a semiconductor layered structure of a light emitting element according to the present embodiment. In the schematic top plan view shown in FIG. 4, the area in which the first semiconductor layer 121 is exposed from the active layer 122 and the second semiconductor layer 123, and the area in which the second semiconductor layer 123 is exposed, are shown by hatching with different diagonal lines, for the ease of understanding.

The first semiconductor layer 121 is, for example, an n-type semiconductor layer. That is, the first conductivity type is an n-type in the present embodiment. However, the first conductivity type may be a p-type. The first semiconductor layer 121 covers a substantially entire upper surface of the substrate 110. The first semiconductor layer 121 has a shape in conformity to the shape of the substrate 110 in a top plan view, which is, for example, a quadrangular shape. However, the substrate 110 and the first semiconductor layer 121 may have other appropriate shapes in a top plan view.

The active layer 122 is disposed on a region $121s1$ that is a portion of the upper surface of the first semiconductor layer 121. The active layer 122 has a quadrangular shape with rounded corners in a top plan view, for example. However, the shape of the active layer 122 in a top plan view can be appropriately determined.

The second semiconductor layer 123 is, for example, a p-type semiconductor layer. That is, the second conductivity type is a p-type in the present embodiment. However, the second conductivity type may be an n-type. The second semiconductor layer 123 covers a substantially entire upper surface of the active layer 122. The second semiconductor layer 123 has a shape in conformity to the shape of the active layer 122 in a top plan view, which is, for example, a quadrangular shape with rounded corners. However, the second semiconductor layer 123 may have other appropriate shapes in a top plan view.

The outer peripheries of the active layer 122 and the second semiconductor layer 123 are located inward of the outer periphery of the first semiconductor layer 121. Therefore, the region $121s2$ of the outer periphery of the upper surface of the first semiconductor layer 121 is exposed from the active layer 122 and the second semiconductor layer 123.

Further, a plurality of through-holes 124 are formed in the active layer 122 and the second semiconductor layer 123. Each through-hole 124 penetrates the active layer 122 and the second semiconductor layer 123 in the Z-direction, as shown in FIG. 2. As shown in FIG. 4, the regions $121s3$ of the upper surfaces of the first semiconductor layer 121 that are located right below each of the through-holes 124 are exposed from the active layer 122 and the second semiconductor layer 123.

In the present embodiment, the number of the through-holes 124 is nine, and the nine through-holes 124 are arranged in a matrix of three rows in the Y-direction and three columns in the X-direction. Each of the through-holes 124 is formed in a circular shape in a top plan view. However, each of the through-holes 124 may be formed in another appropriate shape in a top plan view may, which may be an elliptic shape, for example.

In the description below, the region $121s1$ of the upper surface of the first semiconductor layer 121, which is covered by the active layer 122 and the second semiconductor layer 123, of the top surface of the first semiconductor layer 121, is referred to as "covered region $121s1$." Also, the outer peripheral region $121s2$ of the upper surface of the first semiconductor layer 121, which is exposed from the active layer 122 and the second semiconductor layer 123, may be referred to as "first exposed region $121s2$," and the region $121s3$ of the upper surface of the first semiconductor layer 121, which is located right below each of the through-holes 124, may be called "second exposed region $121s3$."

As shown in FIG. 2, the first exposed region $121s2$ is located lower than the covering region $121s1$. Each of the second exposed regions $121s3$ is recessed downward than the covering region $121s1$. The first exposed region $121s2$ and each of the second exposed regions $121s3$ are formed by, for example, disposing the active layer 122 and the second semiconductor layer 123 on substantially the entire region of the upper surface of the first semiconductor layer 121, then, removing portions of the first semiconductor layer 121, portions of the active layer 122, and portions of the second semiconductor layer 123.

The number of the second exposed regions $121s3$ corresponds to the number of the through-holes 124, which is for example 9, nine as shown in FIG. 4. The nine second exposed regions $121s3$ are arranged in a matrix of three rows in the Y-direction and three columns M1, M2, and M3, in the X-direction, as similar to those of the through-holes 124. In other words, each of the rows of M1, M2, and M3 has three second exposed regions $121s3$ arranged in the Y-direction. In the description below, the three columns of M1, M2, and M3 arranged in the X-direction are indicated in this order as "first column M1," "second column M2," and "third column M3." The three second exposed regions $121s3$, arranged in the Y-direction in the second column M2, will be referred to as "first region A1," "second region A2," and "third region A3" in the description below. However, when the number of the second exposed regions $121s3$ is two or more, this is not limited to the above. The positions of the second exposed regions $121s3$ other than those described above may also be employed.

As described above, the first semiconductor layer 121 includes the first region A1 and the second region A2, which are arranged next to each other and are exposed from the active layer 122 and the second semiconductor layer 123. The first semiconductor layer 121 further includes the third region A3 arranged next to the second region A2 and exposed from the active layer 122 and the second semiconductor layer 123.

Figure 5:
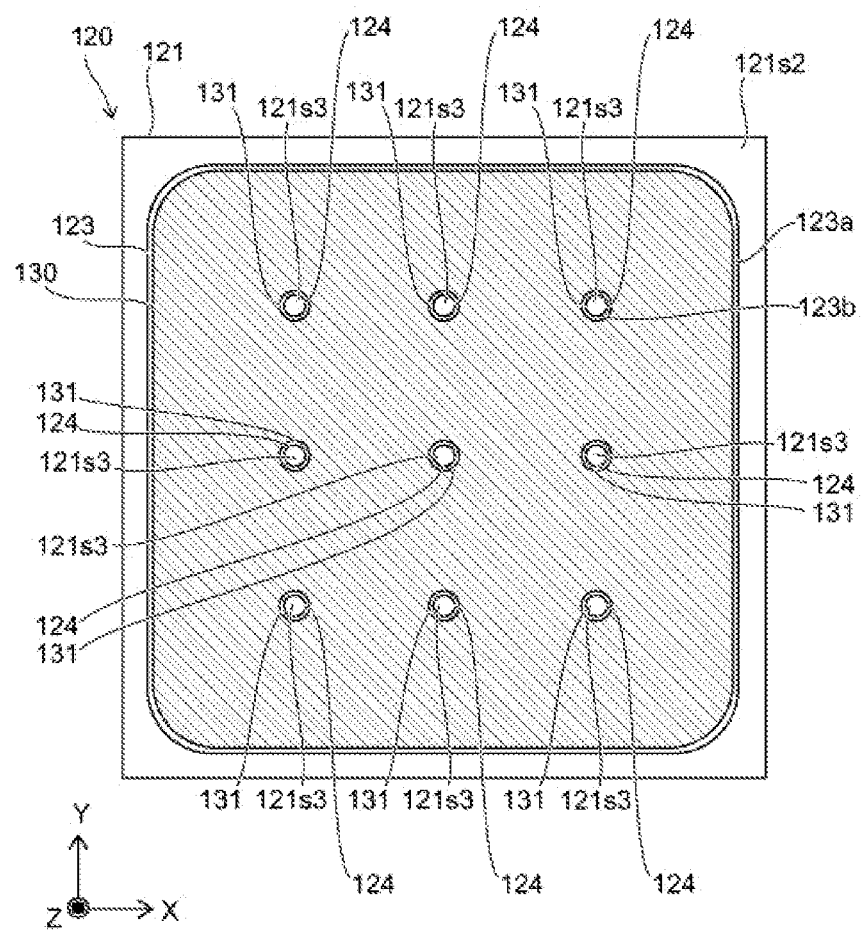
FIG. 5 is a schematic top plan view showing a semiconductor layered structure and a light-reflecting electrode of a light emitting element according to one embodiment.

FIG. 5 is a schematic top plan view showing a semiconductor layered structure and a light-reflecting electrode of a light emitting element according to one embodiment. In the schematic top plan view shown in FIG. 5, the region disposed with the light-reflecting electrode 130 is shown by hatching with diagonal lines for the ease of understanding.

The light-reflecting electrode 130 is made of a metal material. Examples of the metal material used for the light-reflecting electrodes 130 include silver (Ag), aluminum (Al), nickel (Ni), titanium (Ti), platinum (Pt) or alloys having those metals as its main components. The light-reflecting electrode 130 preferably has a high reflectance to light emitted by the active layer 122. For example, it is preferable that the light-reflecting electrode 30 has a reflectance of 70% or greater, preferably 80% or greater to the wavelength of light from the active layer 122.

The light-reflecting electrode 130 is disposed on the second semiconductor layer 123 and is electrically connected to the second semiconductor layer 123. In the present specification, a recitation that two members are "connected" means that the two members are electrically connected, which includes cases when two members are electrically connected to each other by physically in contact with each other, and when two components are electrically connected to each other through an electrically conductive member disposed between the two members, for example. In the present embodiment, as shown in FIG. 2, the light-reflecting electrode 130 is in contact with the upper surface of the second semiconductor layer 123.

The light-reflecting electrode 130 is disposed on a portion of the upper surface of the second semiconductor layer 123 in the present embodiment. More specifically, as shown in FIG. 5, the light-reflecting electrode 130 is located inward of the outer periphery of the second semiconductor layer 123. With this arrangement, an outer peripheral region 123a of the upper surface of the second semiconductor layer 123 is exposed from the light-reflecting electrode 130. The light-reflecting electrode 130 has a shape, for example, in conformity to the shape of the second semiconductor layer 123, which is a quadrangular shape with rounded corners in a top plan view. However, the light-reflecting electrode 130 may have a shape in a top plan view other than that described above.

Further, the light-reflecting electrode 130 is formed with a plurality of through-holes 131 corresponding to the plurality of second exposed regions 121s3. Each of the through-holes 131 is located above the second exposed region 121s3. In a top plan view of the light-reflecting electrode 130, each of the through-holes 131 is formed with an opening in a shape, for example, corresponding to the shape of a corresponding one of the second exposed regions 121s3, which is a circular shape. However, the opening of each of the through-holes 131 can be of any appropriate shape in a top plan view. As shown in FIG. 2, each through hole 131 is formed through the light-reflecting electrode 130 in the Z-direction. The opening diameter of the through-holes 131 is greater than the opening diameter of the through holes 124 formed through the active layer 122 and the second semiconductor layer 123. Therefore, the region 123b of the upper surface of the second semiconductor layer 123 around the opening of each of the through holes 124 is exposed in a corresponding one of the through hole 131 in the top plan view. However, the opening diameter of each through hole 131 may be the same as the opening diameter of a corresponding one of the through holes 124 formed through the active layer 122 and the second semiconductor layer 123. The light-reflecting electrode 130 may cover the entire of the upper surface of the second semiconductor layer 123.

Figure 6:
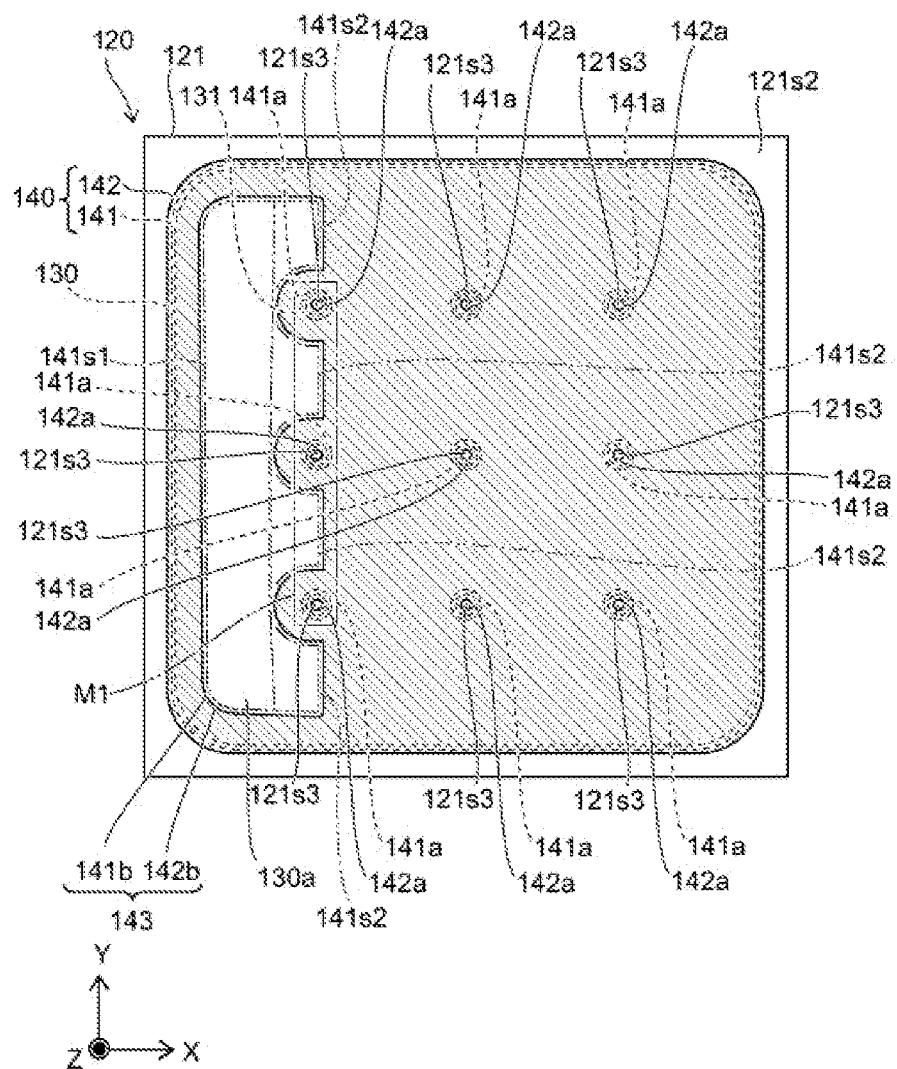
FIG. 6 is a schematic top plan view showing a semiconductor layered structure, a light-reflecting electrode, and a first electrically insulating film according to one embodiment.

FIG. 6 is a schematic top plan view showing a semiconductor layered structure, a light-reflecting electrode, and a first electrically insulating film according to the present embodiment. In FIG. 6, the region disposed with the first electrically insulating film 140 is shown by hatching with diagonal lines for the ease of understanding.

The first electrically insulating film 140 covers portions of the surfaces of the semiconductor layered structure 120. The first electrically insulating film 140 has a two-layer structure in the present embodiment. More specifically, the first electrically insulating film 140 includes a first layer 141 and a second layer 142 disposed on the first layer 141. Examples of the material of the first layer 141 and the second layer 142 include silicon nitride (SiN) and silicon oxide (SiO$_2$). In the present embodiment, the materials of the first layer 141 and the material of the second layer 142 differ from each other. The material of the first layer 141 is, for example, a nitride such as silicon nitride (SiN), and the material of the second layer 142 is, for example, an oxide such as silicon oxide (SiO$_2$). However, other appropriate materials can be used for the first layer and the second layer. Also, the same material may be used for the first layer 141 and the second layer 142. Further, the first electrically insulating film 140 may have a single layer structure or a layered structure including three or more layers.

As shown in FIG. 2, the first layer 141 of the first electrically insulating film 140 covers regions of the surfaces of the light-reflecting electrode 130 and regions of the upper surface of the second semiconductor layer 123 that are exposed from the light-reflecting electrode 130. The regions of the upper surface of the second semiconductor layer 123 exposed from the reflective electrode 130 are a region of outer periphery 123a and a region 123b around the second exposed region 121s3 in the present embodiment. The first layer 141 of the first electrically insulating film 140 is disposed such that the first exposed region 121s2, each of the second exposed regions 121s3, and a portion 130a of the upper surface of the light-reflecting electrode 130 are exposed.

The outer periphery of the first layer 141 is located outward of the outer periphery of the light-reflecting electrode 130. The first layer 141 has a shape, for example, corresponding to the shape of the light-reflecting electrode 130 in a top plan view, which is a quadrangular shape with rounded corners. The shape of the first layer 141 in a top plan view can be appropriately determined. As shown in FIG. 2, outer peripheral portion of the surfaces of the light-reflecting electrode 130 are covered by the first layer 141.

As shown in FIG. 6, the first layer 141 of the first electrically insulating film 140 is formed with a plurality of openings 141a corresponding to a plurality of the second exposed regions 121s3. Each of the openings 141a is located directly above a corresponding one of the second exposed regions 121s3. In a top plan view, each of the openings 141a is formed, for example, substantially in conformity to the shape of a corresponding one of the second exposed regions 121s3, which is a circular shape. However, the shape of each of the openings 141a can be appropriately determined. As shown in FIG. 2, the diameter of each opening 141a is substantially same as the diameter of the through-holes 124 formed in the active layer 122 and the second semiconductor layer 123, and is smaller than the diameter of the through-hole 131 formed in the light-reflecting electrode 130. Each of the openings 141a is formed through the first layer 141 in the Z-direction. Accordingly, each of the second exposed regions 121s3 is exposed from the first layer 141. In addition, the first layer 141 covers the inner lateral surfaces 130b of the light reflecting electrode 130 defining each of the through-holes 131 and portions 123b of the upper surface of the second semiconductor layer 123 around each of the through-holes 124.

Further, as shown in FIG. 6, the first layer 141 defines an opening 141b. The portion of the first layer 141 defining the first opening 141b includes a portion defining a first opening region 141s1 and four portions each defining a second opening region 141s2, the first opening region 141s1 is connected to the second opening regions 141s2. The first opening region 141s1 is formed with an approximately rectangular shape with a longitudinal direction in the Y-direction. The first opening region 141s1 is located between the first exposed region 121s2 and the first row M1. The four second opening regions 141s2 are aligned in the Y-direction. The four second opening regions 141s2 merges with the first opening region 141s1 in the X-direction. In the top plan view, the second exposed region 121s3 in the first row M1 is positioned between the second opening regions 141s2, which are adjacent to each other in the Y-direction. The shape of the opening 141b in a top plan view can be appropriately determined. As shown in FIG. 2, the opening 141b is formed through the first layer 141 in the Z-direction. Accordingly, the region 130a of the upper surface of the light-reflecting electrode 130 is exposed from the first layer 141.

As shown in FIG. 6, the outer periphery of the second layer 142 is located outward of the outer periphery of the first layer 141. The shape of the second layer 142 in the top plan view corresponds, for example, to the shape of the first layer 141, and is a quadrangular shape with rounded corners. However, any other appropriate shape in a top plan view can be employed for the second layer 142.

Further, the second layer 142 defines a plurality of openings 142a corresponding to the plurality of second exposed regions 121s3. Each of the openings 142a is located directly above a corresponding one of the second exposed regions 121s3. The shape of each of the openings 142 in a top plan view corresponds, for example, to the shape of the second exposed region 121s3, which is a circular shape. However, any other appropriate shape in a top plan view can be employed for the openings 142a. As shown in FIG. 2, the diameter of each opening 142a is smaller than the diameter of the second exposed region 121s3, i. e., the diameter of the through-hole 124 formed through the active layer 122 and the second semiconductor layer 123. Each opening 142a is formed through the second layer 142 in the Z-direction. Therefore, the center region of each of the second exposed regions 121s3 is exposed from the second layer 142. Further, the second layer 142 is configured to cover the lateral surface defining each of the through holes 124 formed through the active layer 122 and the second semiconductor layer 123, and outer peripheral portion of each of the second exposed region 121s3.

Further, the second layer 142 of the first electrically insulating film 140 defines an opening 142b. The opening 142b is located directly above the opening 141b of the first layer 141. The opening 142b is formed through the second layer 142 in the Z-direction. With this arrangement, the region 130a of the upper surface of the light-reflecting electrode 130 is exposed from the second layer 142. As shown in FIG. 6, the shape of the opening 142b in the top plan view is, for example, substantially the same as the shape of the opening 141b in the first layer 141. The lateral surface defining the opening 141b and the lateral surface defining the opening 142b are substantially identical. But the shape of the opening 141b in a top plan view may have other appropriate shape.

Each opening 142a will be referred to as "first opening 142a." The opening 141b of the first layer 141 and the opening 142b of the second layer 142 directly above the opening 141b form an opening 143. In the description below, the opening 143 will be referred to as "second opening 143." In the present embodiment, the first layer 141 and the second layer 142 are provided, but when the first layer 141 is not provided, the opening 142b in the second layer 142 corresponds to the second opening 143. As described above, the first electrically insulating film 140 has a first opening 142a, which is located above each second exposed region 121s3, and a second opening 143 formed in a portion of the upper surface of the semiconductor layer 123.

Figure 7:
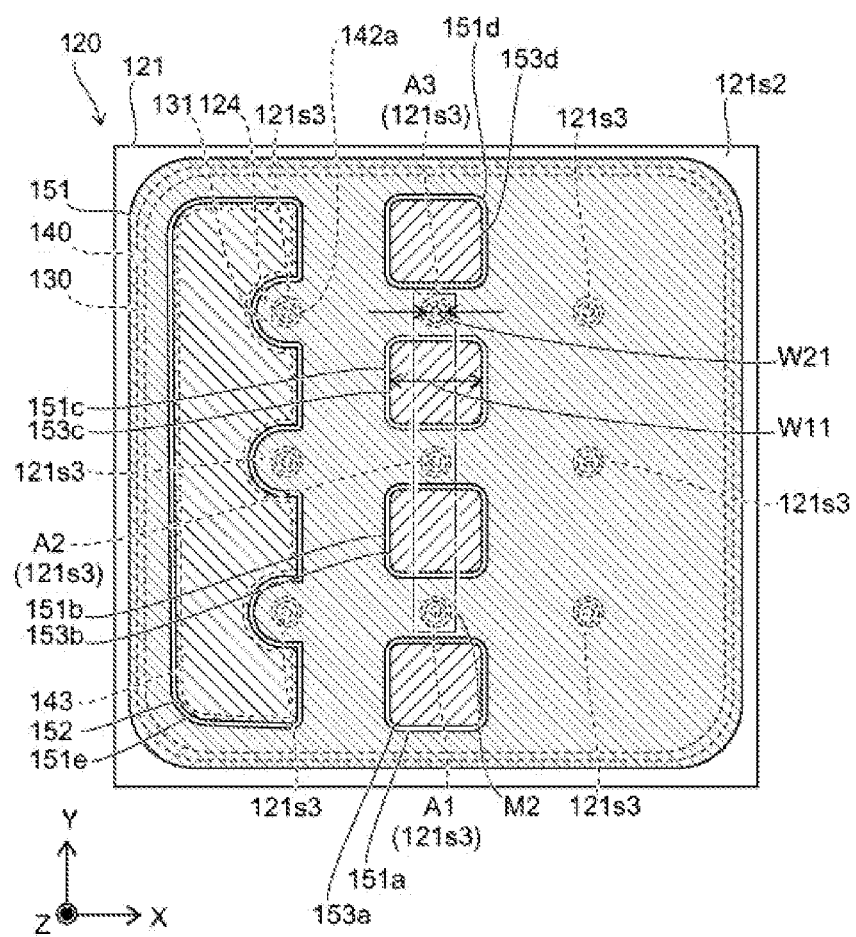
FIG. 7 is a schematic top plan view showing a semiconductor layered structure, a light-reflecting electrode, a first electrically insulating film, a first electrode, a second electrode, and a metal layer according to one embodiment.

FIG. 7 is a partial cross-sectional view of a light emitting device according to a first embodiment. FIG. 7 shows the area where the first electrode 151, the second electrode 152, and the metal layers 153a, 153b, 153c and 153d are located, with hatching with different diagonal lines for the ease of understanding.

The first electrode 151 is disposed on the first electrically insulating film 140, which is located on the second semiconductor layer 123, and is electrically connected to the first semiconductor layer 121 via the first openings 142a. The outer periphery of the first electrode 151 is located outward of the outer periphery of the first electrically insulating film 140, and as shown in FIG. 2, the first electrode 151 is in contact with the first exposed region 121s2. Further, the first electrode 151 is disposed in each of the first openings 142a and is in contact with each of the second exposed region 121s3. As described above, the first electrode 151 is electrically connected to the first semiconductor layer 121 though being in contact with the first exposed region 121s2 and each of the second exposed regions 121s3. The first electrode 151 has a shape, for example, corresponding to the shape of the first electrically insulating film 140, which is a quadrangular shape with rounded corners, in a top plan view. The first electrode 151 can have an appropriate of is located above the first electrode 151a be appropriately determined. The first electrode 151 contains a metal material, for example, aluminum (Al).

As shown in FIG. 7, the first electrode 151 defines a plurality of through-holes 151a, 151b, 151c, and 151d. In a top plan view, the plurality of through-holes 151a, 151b, 151c, and 151d are aligned in the Y-direction. In the Y-direction, the plurality of through-holes 151a, 151b, 151c, and 151d are aligned alternately with a first region A1, a second region A2, and a third region A3. More specifically, the through-hole 151a is located between the first exposed region 121s2 and the first region A1 in a top plan view. The through-hole 151b is located between the first region A1 and the second region A2 in the top plan view. The through-hole 151c is located between the second region A2 and the third region A3 in the top plan view. The through-hole 151d is located between the third region A3 and the first exposed region 121s2 in the top plan view.

Each of the through-holes 151a, 151b, 151c, and 151d is formed with an opening shape in a top plan view which is a quadrangular shape with rounded corners. However, other than above, each of the through-holes 151a, 151b, 151c, and 151d can be formed with an opening defined by an appropriate shape in the top plan view, which can be a polygonal shape other than a quadrangular shape with rounded corners, but may be, a polygonal shape with unrounded corners, or a circular shape. As shown in FIG. 3, each of the through holes 151a, 151b, 151c, and 151d is formed through the first electrode 151 in the Z-direction. Accordingly, a portion of the first electrically insulating film 140 is exposed from the first electrode 151.

In the description below, the through-hole 151b may also be referred to as the "first through-hole 151b." The through-hole 151c may also be referred to as the "second through-hole 151c." The through-hole 151a may also be referred to as the "third through-hole 151a." The through-hole 151d may also be referred to as the "fourth through-hole 151d."

As shown in FIG. 7, the first electrode 151 defines an opening 151e that exposes the second opening 143 of the first electrically insulating film 140. The opening 151e is located directly above the second opening 143. The shape of the opening 151e corresponds, for example, to the shape of the second opening 143. More specifically, the opening 151e is formed with a first opening region of an approximately rectangular shape having a long-side along the Y-direction, and four second opening regions aligned in the Y-direction and each merged with the first opening region 141s1 in the X-direction. The shape of the opening 151e in a top plan view can be appropriately determined. The opening 151e is larger than the second opening 143.

The second electrode 152 is electrically connected to the second semiconductor layer 123 through the second opening 143 of the first electrically insulating film 140. More specifically, the second electrode 152 is disposed inward of the opening 151e of the first electrode 151 and in the second opening 143 of the first electrically insulating film 140 and is electrically connected to the second semiconductor layer 123 through the opening 151e and the second opening 143. In a top plan view, the shape of the second electrode 152 corresponds, for example, to the shape of the second opening 143. More specifically, the second electrode 152 includes a base member having an approximately rectangular shape with its longitudinal direction in the Y-direction, and four extended portions aligned in the Y-direction and each extended from the base member in the X-direction. However, the shape of the second electrode 152 in a top plan view can be appropriately determined. As shown in FIG. 2, the second electrode 152 is disposed along the surfaces defining the second opening 143 of the first electrically insulating film 140 such that the second electrode 152 is in contact with the region 130a of the upper surface of the light-reflecting electrode 130 exposed in the second opening 143. With this arrangement, the second electrode 152 is electrically connected to the second semiconductor layer 123. A portion of the second electrode 152 is located in the area around the second opening 143 on the upper surface of the first electrically insulating film 140. The second electrode 152 contains a metal material such as aluminum (Al).

The metal layers 153a, 153b, 153c and 153d are disposed on the first electrically insulating film 140, which is located on the second semiconductor layer 123, and are electrically insulated from the first electrode 151 and the second electrode 152. In the present specification, the recitation that "metal layers 153a, 153b, 153c and 153d are electrically insulated from the first electrode 151 and the second electrodes 152" means that the metal layers 153a, 153b, 153c and 153d are electrically insulated from the first electrode 151 and the second electrodes 152 in the light emitting element 100. However, for example, when the light emitting element 100 is mounted on the base member in the variational example to be described later below, the metal layers 153a, 153b, 153c, and 153d may be electrically connected to the second electrode 152 through an electrically conductive member of the base member. The metal layers 153a, 153b, 153c, and 153d include a metal material such as aluminum (Al). From the perspective of improving heat dissipation, each of the metal layers 153a, 153b, 153c, and 153d, preferably have a thickness, for example, in a range of 0.8 to 2 μm.

As shown in FIG. 7, the metal layer 153a is disposed in the third through-hole 151a. The metal layer 153b is disposed in the first through-hole 151b. The metal layer 153c is disposed in the second through-hole 151c. The metal layer 153d is disposed in the fourth through-hole 151d. The metal layers 153a, 153b, 153c and 153d are spaced apart from the first electrode 151.

In the description below, the metal layer 153b disposed in the first through-hole 151b may also be referred to as "first metal layer 153b." The metal layer 153c disposed in the second through-hole 151 may also be referred to as "second metal layer 153c." The metal layer 153a disposed in the third through-hole 151a may also be referred to as "third metal layer 153c." The metal layer 153d, disposed in the fourth through-hole 151d may also be referred to as "fourth metal layer 153d."

The third metal layer 153a is located between the first exposed region 121s2 and the first region A1 in a top plan view. The first metal layer 153b is located between the first region A1 and the second region A2 in a top plan view. The second metal layer 153c is located between the second region A2 and the third region A3 in a top plan view. In other words, the second region A2 is located between the first metal layer 153b and the second metal layer 153c in a top plan view. The fourth metal layer 153d is located between the third region A3 and the first exposed region 121s2 in a top plan view.

The shapes of the metal layers 153a, 153b, 153c and 153d in a top plan view correspond, for example, to the shapes of the respective corresponding through-holes 151a, 151b, 151c and 151d, which are a quadrangular shape with rounded corners. However, other than above, the shape of the metal layers 153a, 153b, 153c and 153d in a top plan view can be appropriately determined.

The metal layers 153a, 153b, 153c and 153d have a substantially same width W11 in the X-direction. The width W11 of the metal layers 153a, 153b, 153c and 153d is greater than the width W21 of the first region A1 and the second region A2 in the X-direction, that is the diameter of the through-hole 124 formed in the active layer 122 and the second semiconductor layer 123. However, the metal layers may have different widths W11.

The location of the first electrode 151, the location of the second electrode 152, and the locations of the metal layers 153a, 153b, 153c, and 153d can be appropriately determined. Also, one or more metal layers can be employed. A metal layer may be disposed between the second exposed region 121s3 in the second column M1 and the second exposed region 121s3 in the second column M2. A metal layer may be disposed between the second exposed region 121s3 in the second column M2 and the second exposed region 121s3 in the third column M3.

Figure 8:
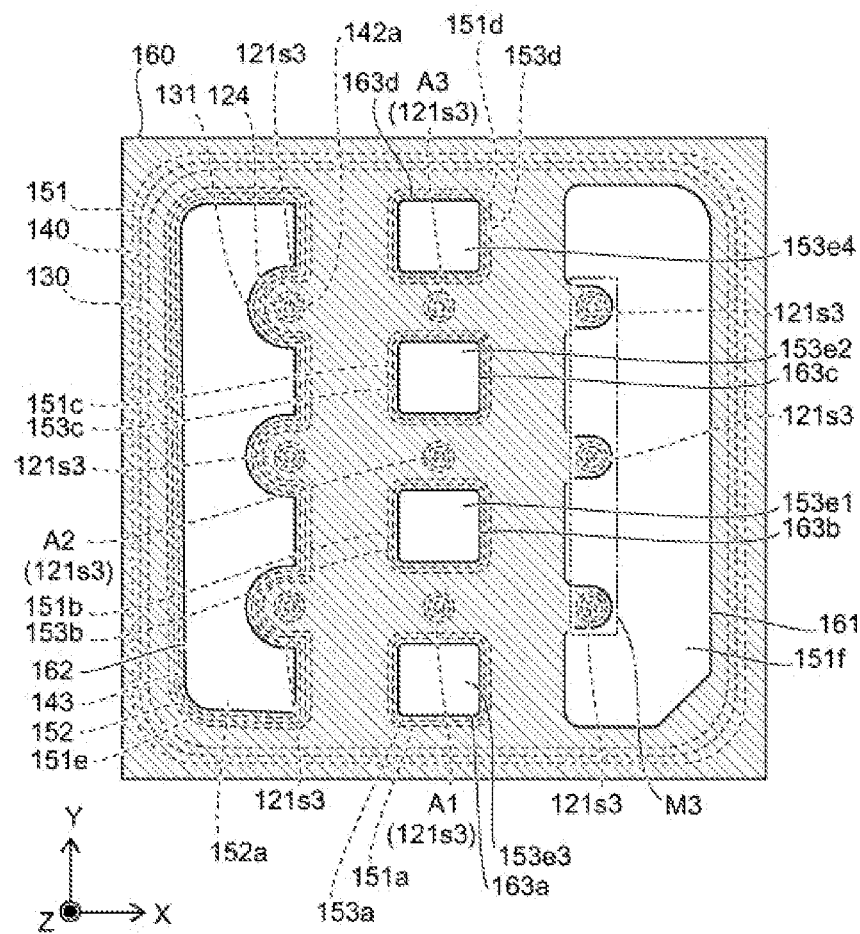
FIG. 8 is a schematic top plan view showing a semiconductor layered structure, a light-reflecting electrode, a first electrically insulating film, a first electrode, a second electrode, a metal layer, and a second electrically insulating film according to one embodiment.

FIG. 8 is a schematic top plan view showing a semiconductor layered structure, a light-reflecting electrode, a first electrically insulating film, a first electrode, a second electrode, a metal layer, and a second electrically insulating film according to the present embodiment. In FIG. 8, the region where the second electrically insulating film 160 is located is shown by hatching with diagonal lines, for the ease of understanding.

The second electrically insulating film 160 covers a portion of the first electrode 151, a portion of the second electrode 152, a portion of each of the metal layers 153a, 153b, 153c, and 153d. The material of the second electrically insulating film 160 is, for example, an oxide such as silicon oxide ($SiO_2$), but the material of the second electrically insulating film 160 can be appropriately determined.

The second electrically insulating film 160 is formed with a third opening 161 to expose a different portion 151f of the first electrode 151. The third opening 161 is located between the first exposed region 121s2 and the third column M3 in a top plan view. As shown in FIG. 2, the third opening 161 is formed through the second electrically insulating film 160 in the Z-direction. With this arrangement, the different portion 151f of the first electrode 151 exposed in the third opening 161 is a portion located on the first electrically insulating film 140, in the present embodiment. However, the third opening 161 can be at a different location.

As shown in FIG. 8, the second electrically insulating film 160 is formed with a fourth opening 162 to expose a different portion 152a of the second electrode 152. The fourth opening 162 is located directly above the second electrode 152. The shape of the fourth opening 162 corresponds, for example, to the shape of the second electrode 152 in a top plan view. More specifically, the fourth opening 162 is formed with a first opening region of an approximately rectangular shape having a long-side along the Y-direction, and the four second opening regions aligned in the Y-direction, and each merged with the first opening region in the X-direction. However, other than above, the shape of the fourth opening 162 in a top plan view can be appropriately defined. The fourth opening 162 is smaller than the second electrode 152. As shown in FIG. 2, the fourth opening 162 is formed through the second electrically insulating film 160 in the Z-direction. With this arrangement, the different portion 152a of the second electrode 152 is exposed from the second electrically insulating film 160.

As shown in FIG. 8, the second electrically insulating film 160 is formed with (defines) a fifth opening 163b exposing a different portion 153e1 of the first metal layer 153b, a sixth opening 163c exposing a different portion 153e2 of the second metal layer 153c, a seventh opening 163a exposing a different portion 153e3 of the third metal layer 153a, and an eighth opening 163d exposing a different portion 153e4 of the fourth metal layer 153d.

The fifth opening 163b is located directly above the first metal layer 153b. The sixth opening 163c is located directly above the second metal layer 153c. The seventh opening 163a is located directly above the third metal layer 153a. The eighth opening 163d is located directly above the fourth metal layer 153d. The shapes of openings 163a, 163b, 163c and 163D in the top plan view correspond, for example, to the shapes of the respective corresponding metal layers 153a, 153b, 153c and 153d, which can be a quadrangular shape with rounded corners. However, the openings 163a, 163b, 163c and 163d can be defined in other appropriate shape in a top plan view. In a top plan view, the sizes of the openings 163a, 163b, 163c and 163d are smaller than respective corresponding metal layers 153a, 153b, 153c and 153d. As shown in FIG. 3, the openings 163a, 163b, 163c and 163d are formed through the second electrically insulating film 160 in the Z-direction.

Figure 9:
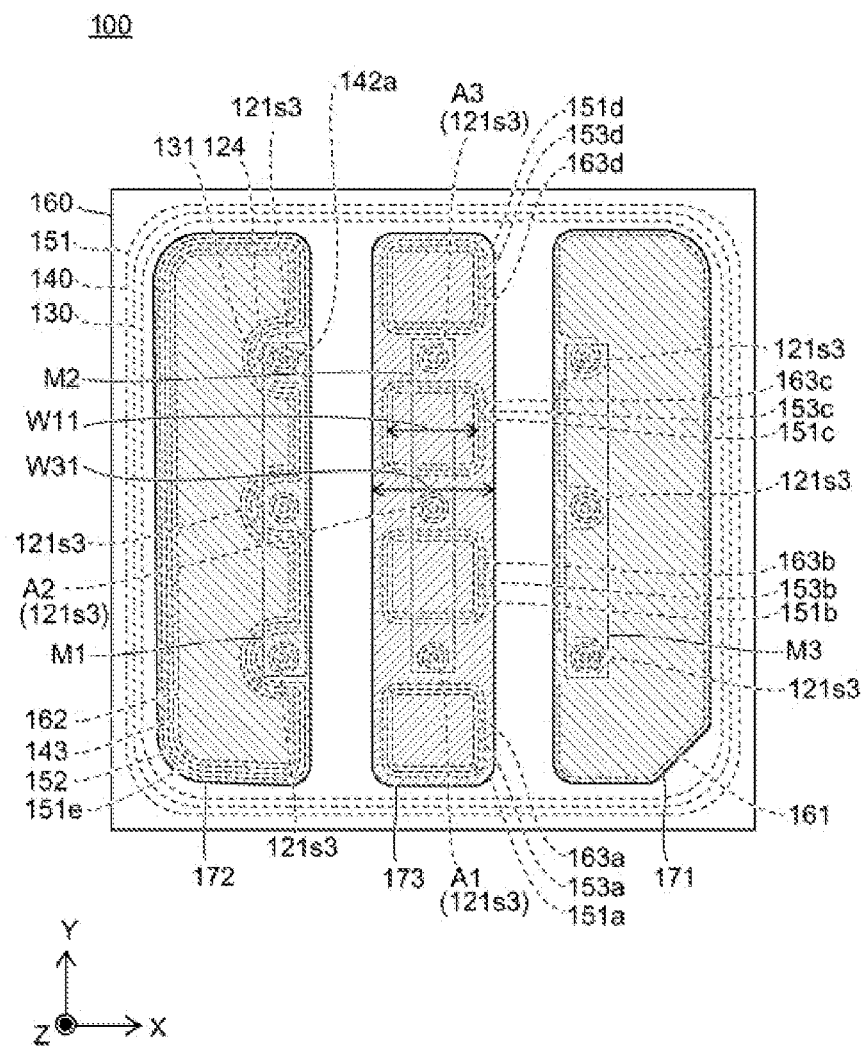
FIG. 9 is a schematic top plan view showing a light emitting element according to one embodiment.

FIG. 9 is a schematic top plan view showing a light emitting element according to the present embodiment. In FIG. 9, the regions where the first terminal 171, the second terminal 172, and the metal member 173 are located are shown by hatching with diagonal lines for the ease of understanding.

The first terminal 171 is located on the first electrode 151 and is in contact with the first electrode 151. With this arrangement, the first terminal 171 is electrically connected to the first electrode 151. More specifically, as shown in FIG. 2 and FIG. 9, a portion of the first terminal 171 is located in the third opening 161 of the second electrically insulating film 160, and is in contact with the different portion 151f of the first electrode 151. As described above, the first terminal 171 is electrically connected to the first electrode 151 through the third opening 161. Another portion of the first terminal 171 is located on the upper surface of the second electrically insulating film 160, at a region surrounding the third opening 161. Through the second electrically insulating film 160, the first terminal 171 also covers portions of the first electrode 151 located directly above the three second exposed regions 121s3 in the third column M3. In other words, the three second exposed regions 121s3 in the third column M3 are located inward of the outer edge of the first terminal 171 in a top plan view. However, other than those described above, the first terminal 171 can be located appropriately, as long as it is possible to connect to the first electrode 151. The first terminal 171 contains a metal material such as nickel (Ni), titanium (Ti), platinum (Pt), copper (Cu), and gold (Au). From the perspective of improving heat dissipation, the first terminal 171 preferably has a thickness, for example, in a range of 0.8 to 2 µm.

The second terminal 172 is disposed on the second electrode 152 and is electrically connected to the second electrode 152. More specifically, as shown in FIG. 2 and FIG. 3, a portion of the second terminal 172 is disposed along the surface defining the fourth opening 162 of the second electrically insulating film 160, and is in contact with the second electrode 152. Thus, the second terminal 172 is connected to the second electrode 152 through the fourth opening 162. Another portion of the second terminal 172 is located on the upper surface of the second electrically insulating film 160, at a region surrounding the fourth opening 162. Through the second electrically insulating film 160, the second terminal 172 also covers portions of the second electrode 152 located directly above the three second exposed regions 121s3 in the first column M1. In other words, the three second exposed regions 121s3 in the first column M1 are located inward of the outer edge of the second terminal 172 in a top plan view. However, other than those described above, the second terminal 172 can be located appropriately, as long as it is possible to connect to the second electrode 151. The second terminal 172 can be made of, for example, a metal material similar to that of the first terminal 171. It is preferable that the second terminal 172 has a thickness, for example, in a range of 0.8 to 2 µm, similar to that of the first terminal 171.

As shown in FIG. 9, the second terminal 172 has a quadrangular shape with rounded corners, in a top plan view. The first terminal 171 has a shape, in a top plan view, that is symmetrical to the shape of the second terminal 172 with respect to a line along the Y-direction, with a missing corner at outer periphery. As described above, the shape of the first terminal 171 and the shape of the second terminal 172 differ from each other. Therefore, it is easy to distinguish between the first terminal 171 and the second terminal 172. However, the first terminal 171 and the second terminal 172 may have shapes different than those described above. For example, the first terminal 171 and the second terminal 172 may have the same shape in a top plan view.

The metal member 173 is located above the first electrically insulating film 140, which is located above the second semiconductor layer 123. In the present embodiment, the metal member 173 is located on the metal layers 153a, 153b, 153c and 153d, and are electrically insulated from the first terminal 171 and the second terminal 172. In the present specification, the recitation that "metal member 173 is electrically insulated from the first terminal 171 and the second terminal 172" means that the metal member 173 is electrically insulated from the first terminal 171 and the second terminal 172 in the light emitting element 100. However, for example, when the light emitting element 100 is mounted on the base member in the variational example to be described later below, the metal member 173 and the second terminal 172 may be electrically connected through an electrically conductive member of the base member. The metal member 173 can be made of a metal material similar to that of the first terminal 171 and the second terminal 172. From the perspective of improving heat dissipation, the metal member 173 preferably has a thickness, for example, in a range of 0.8 to 2 μm.

The metal member 173 is disposed between the first terminal 171 and the second terminal 172. As shown in FIG. 3, portions of the metal member 173 are located in the fifth opening 163b, the sixth opening 163c, the seventh opening 163a, and the eighth opening 163d of the second electrically insulating film 160, and are in contact with the metal layers 153a, 153b, 153c and 153d respectively. In a top plan view, a portion of the metal member 173 is located between the first region A1 and the second region A2.

A portion of the metal member 173 is located on a region of the upper surface of the second electrically insulating film 160 between the fifth opening 163b and the sixth opening 163c that are formed adjacent to each other in the second electrically insulating film 160. Similarly, a portion of the metal member 173 is located on a region between the fifth opening 163b and the seventh opening 163a of the second electrically insulating film 160. Similarly, a portion of the metal member 173 is located on a region of the upper surface of the second electrically insulating film 160 between the sixth opening 163c and the eighth opening 163d that are formed adjacent to each other in the second electrically insulating film 160. Accordingly, the metal member 173 covers the first region A1, the second region A2, and the third region A3 through the second electrically insulating film 160. A portion of the metal member 173 may be disposed overlapping the first region A1, the second region A2, and the third region A3 in a top plan view. In FIG. 9, the first region A1, the second region A2, and the third region A3 are located inward of the outer edge of the metal member 173 in a top plan view.

The metal member 173 has, for example, a quadrangular shape with rounded corners in a top plan view. Other than the above, the shape of the metal member 173 in a top plan view can be appropriately determined.

The metal member 173 has a width W31 in the X-direction in a top plan view greater than the width W11 of the metal layers 153a, 153b, 153c, and 153d. However, the width W31 may be equal to or smaller than the width W11.

Figure 10:
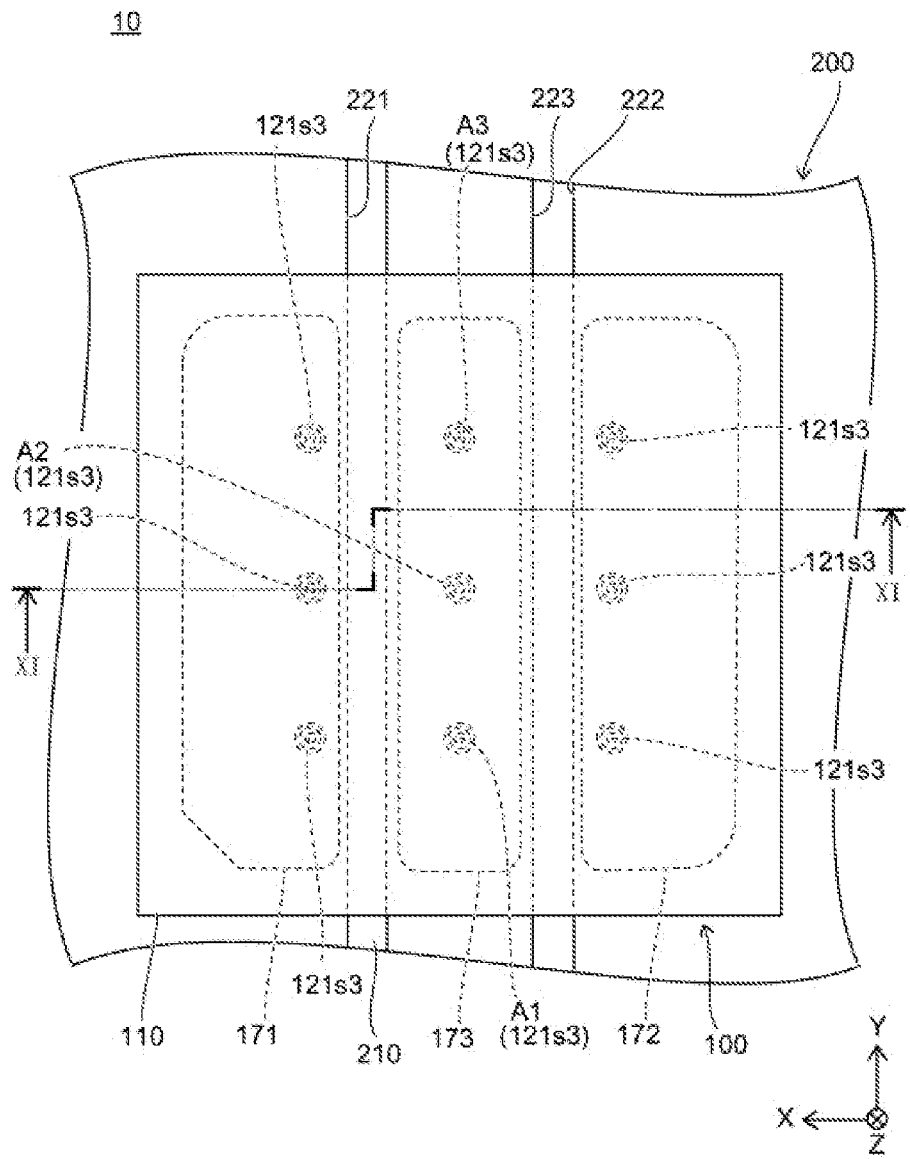
FIG. 10 is a schematic top plan view of a light emitting device according to one embodiment.
Figure 11:
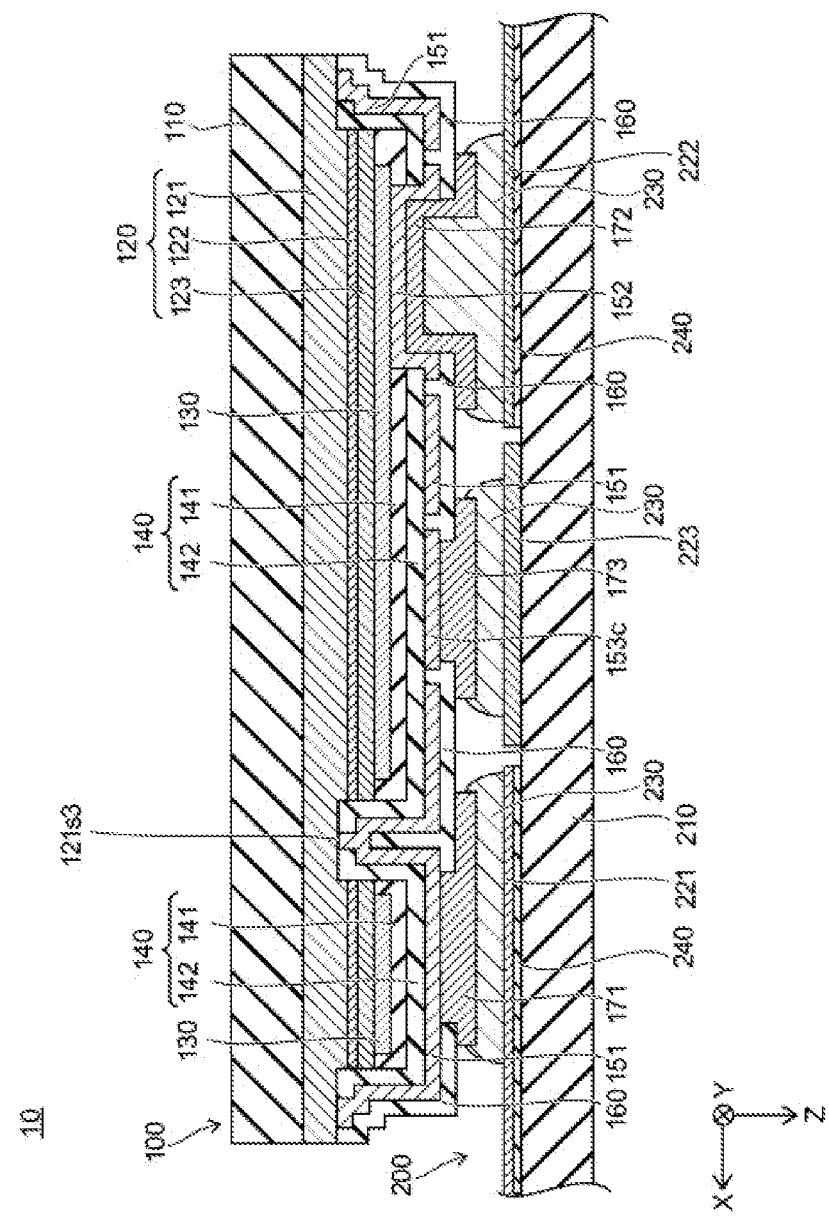
FIG. 11 is a schematic cross-sectional view taken along line XI-XI of FIG. 10.

FIG. 10 is a schematic top plan view of a light emitting device according to the present embodiment. FIG. 11 is a schematic cross-sectional view taken along line XI-XI of FIG. 10. A light emitting device 10 according to the present embodiment includes the light emitting element 100 and a base member 200 mounted with the light emitting element 10. In the description of the light emitting device 10 with reference to FIG. 10 and FIG. 11 below, a direction opposite to the Z-direction will be referred to as "upward direction" for the ease of understanding.

As shown in FIG. 11, the base member 200 includes a support member 210, an electrically insulating member 240, a first electrically conductive member 221, a second electrically conductive member 222, and a third electrically conductive member 223.

The support member 210 can be made of, for example, a metal material such as aluminum (Al) or copper (Cu). The electrically insulating member 240 can be made of, for example, a dielectric material such as silicon oxide (SiO$_2$) or silicon nitride (SiN).

The electrically conductive members 221, 222, and 223 can be made of, for example, a metal material such as copper (Cu). The electrically conductive members 221, 222, and 223 are disposed directly or indirectly on the support member 210.

The electrically insulating member 240 is disposed between the support member 210 and the first electrically conductive member 221 and between the support member 210 and the second electrically conductive member 222. The electrically insulating member 240 is not disposed between the support member 210 and the third electrically conductive member 223.

The first electrically conductive member 221 is electrically connected to the first terminal 171 through a bonding member 230. The second electrically conductive member 222 is electrically connected to the second terminal 172 through the bonding member 230. The third electrically conductive member 223 is electrically connected to the metal member 173 through the bonding member 230. The bonding member 230, the metal member 173, the second metal layer 153c, and the second semiconductor layer 123 are located in this order directly above the third electrically conductive member 223. The bonding member 230 can be made of, for example, an electrically conductive material containing a solder material such as tin (Sn).

In the light emitting element 100 according to the present embodiment, the plurality of metal layers 153a, 153b, 153c, and 153d that are electrically connected to the metal member 173 are electrically insulated from the first electrode 151 and the second electrode 152. When using an electrically conductive material such as aluminum and copper that have relatively high thermal conductivity as a support member 210, an electrically insulating member 240 is needed to be provided between the support member 210 and the first electrically conductive member 221 and between the support member 210 and the second electrically conductive member 222 so as to prevent occurrence of electrical connection therebetween. In the present embodiment, the metal member 173 is electrically insulated from the first electrode 151 and the second electrode 152. Therefore, the electrically insulating member 240 is not necessarily disposed between the support member 210 and the third electrically conductive member 223. Accordingly, it is possible to mount the light emitting element 100 in a state in which the third electrically conductive member 223 is in contact with the support member 210.

Next, operation of the light emitting device according to the present embodiment will be described below. The first electrically conductive member 221 is electrically connected to the first semiconductor layer 121 through the first terminal 171 and the first electrode 151. The second electrically conductive member 222 is electrically connected to the second semiconductor layer 123 through the second terminal 172, the light-reflecting electrode 130, and the second electrode 152. The active layer 122 of the semiconductor layered structure is caused to emit light by applying a voltage between the first electrically conductive member 221 and the second electrically conductive member 222.

At this time, electric current flows from the region of the surface of the second semiconductor layer 123 that is in contact with the light-reflecting electrode 130 toward each of the second exposed regions 121s3 of the first semiconductor layer 121. The total area of the plurality of second exposed region 121s3 is smaller than the region of the surface of the second semiconductor layer 123 that is in contact with the light-reflecting electrode 130. As a result, the current density in a single second exposed region 121s3 is likely to be higher than the current density in the region of the surface of the second semiconductor layer 123 that is in contact with the light-reflecting electrode 130. Therefore, heat is more likely concentrated in a single second exposed region 121s3 than in the surface of the second semiconductor layer 123 that is in contact with the light-reflecting electrode 130.

As shown in FIG. 1, in the light emitting element 100, the first metal layer 153b is disposed between the first region A1 and the second region A2, which are adjacent to each other in a top plan view. Therefore, at least a portion of the heat generated in the first region A1 and the second region A2 propagates to the first metal layer 153b. In addition, the second metal layer 153c is disposed between the second region A2 and the third region A3, which are adjacent to each other in the top plan view. Therefore, at least a portion of the heat generated in second region A2 and the third region A3 propagates to the second metal layer 153c. In addition, the third metal layer 153a is disposed between the first exposed region 121s2 and the first region A1, which are adjacent to each other in the top plan view. Therefore, at least a portion of the heat generated in first region A1 propagates to the third metal layer 153a. In addition, a fourth metal layer 153d is disposed between the third region A3 and the first exposed region 121s2, which are adjacent to each other in the top plan view. Therefore, at least a portion of the heat generated in the third region A3 propagates to the fourth metal layer 153d.

The metal layers 153a, 153b, 153c and 153d are electrically connected to the metal member 173. The metal member 173 is electrically connected to the third electrically conductive member 223 of the base member 200. Therefore, heat propagated to the metal layers 153a, 153b, 153c and 153d can be dissipated efficiently by the metal member 173 and the third electrically conductive material 223.

Next, effects of the embodiments will be described. The light emitting element 100 according to the present embodiment includes the semiconductor layered structure 120, the first electrically insulating film 140, the first electrode 151, a second electrode 152, a first metal layer 153b, a first terminal 171, a second terminal 172, and a metal member 173. The semiconductor layered structure 120 includes the first conductive layer 121 of a first conductivity type, the active layer 122 disposed on a portion of the first semiconductor layer 121, and the second conductive layer 123 of a second conductivity type disposed on the active layer 122. The first semiconductor layer 121 includes the first region A1 and the second region A2 which are located adjacent to each other and are exposed from the active layer 122 and the second semiconductor layer 123. The first electrically insulating film 140 covers the surfaces of the semiconductor layered structure 120 and defines the first opening 142a, which opens on the first region A1 and on the second region A2, and the second opening 143, which opens above a portion of the second semiconductor layer 123. The first electrode 151 is disposed on the first electrically insulating film 140 located above the second semiconductor layer 123, and is electrically connected to the first semiconductor layer 121 through the first opening 142a. The second electrode 152 is electrically connected to the second semiconductor layer 123 through the second opening 143. The first terminal 171 is disposed on first electrode 151 and is electrically connected to first electrode 151. The second terminal 172 is disposed on the second electrode 152 and is electrically connected to the second electrode 152. The metal member 173 is located above the first electrically insulating film 140, which is located above the second semiconductor layer 123, and is electrically insulated from terminal 171 and terminal 172. In the top plan view, a portion of the metal member 173 is located between first region A1 and second region A2.

In the light emitting element 100 described above, at least a portion of the heat generated in the first region A1 and the second region A2 of the first semiconductor layer 121 can be efficiently dissipated by the metal member 173 located between the first region A1 and the second region A2 in the top plan view.

The light emitting element 100 further includes the first metal layer 153b located on the first electrically insulating film 140 and electrically insulated from the first electrode 151 and the second electrode 152. The first metal layer 153b is located between the first region A1 and the second region A2 in a top plan view. The metal member 173 is electrically connected to the first metal layer 153b. In the light emitting element 100 described above, at least a portion of heat generated in the first region A1 and the second region A2 of the first semiconductor layer 121 can be dissipated more efficiently, through the first metal layer 153b located between the first region A1 and the second region A2 in a top plan view, and the metal member 173. Further, with the first metal layer 153b provided on the first electrically insulating film 140, the first electrically insulating film 140 can be prevented from being removed along with the second electrically insulating film 160, when a portion of the second electrically insulating film 160 is removed to form an opening to dispose a portion of the metal member 173 therein. That is, for example, removing of the portion of the second electrically insulating film 160 can be conducted to the portion of the second electrically insulating film 160 located on the first metal layer 153b, such that the first electrically insulating film 140 can be prevented from being removed. As a result, the reliability of the light emitting element 100 can be improved.

The first electrode 151 is located between the first region A1 and the second region A2 and is formed with a first through hole 151b which exposes the first electrically insulating film 140. The first metal layer 153b is located in the first through hole 151b. In the light emitting element 100 described above, heat propagated from the first region A1 and the second region A2 to the first electrode 151 can be dissipated efficiently through the first metal layer 153b.

In the top plan view, a portion of the metal member 173 is disposed overlapping the first region A1. In the light emitting element 100 described above, heat generated in the first region A1 can be dissipated in a short distance through the metal member 173 directly above it.

Furthermore, the first semiconductor layer 121 includes a third region A3 located adjacent to the second region A2 and is exposed from the active layer 122 and the second semiconductor layer 123. The first electrode 151 is located between the second region A2 and the third region A3 and has an additional 151c through the second hole which exposes the first electrically insulating film 140. The light emitting element 100 is located in the second through hole 151c and is further equipped with a second metal layer 153c electrically isolated from electrode 151 and electrode 152. In the top plan view, second region A2 is located between the first metal layer 153*b* and the second metal layer 153*c*. The metal member 173 is electrically connected to the first metal layer 153*b* and the second metal layer 153*c*. In the light emitting element 100 described above, at least part of the heat generated in first region A1, second region A2, and region 3 A3, where the first electrode 151 is connected to the semiconductor layer 121, can be dissipated efficiently by the metal layer 1, the metal layer 153*b*, the metal layer 153*c*, and the metal member.

In addition, the light-emitting element 100 is equipped with a second electrically insulating film 160. The second electrically insulating film 160 will cover part of electrode 151, part of electrode 152, part of metal layer 153*b*, and part of metal layer 153*c*. The second electrically insulating film 160 also has a third opening 161, which exposes the other part of the first electrode 151, a fourth opening 162, which exposes the other part of the second electrode 152, a fifth opening 163*b*, which exposes the other part of the first metal layer 153*b*, and a sixth opening 163*c*, which expose the other part of the second metal layer 153*c*. The eighth wiring 171 is electrically connected to the first p-side electrode 21*p* of the first light emitting element 21 through a third electrically conductive member 161. The second wiring 172 is also electrically connected to the second p-side electrode 22*p* of the second light emitting element 22 through the fourth electrically conductive member 162. The metal member 173 is connected to the first metal layer 153*b* via the fifth opening 163*b* and to the second metal layer 153*c* via the sixth opening 163*c*. In the light emitting element 100 described above, electrode 151 and electrode 152 can be isolated, and metal layers 153*b* and 153*c* and electrode 151 can be isolated.

In the upper view, the metal member 173 covers the second region A2 through the second electrically insulating film 160. In the light emitting element 100 described above, heat generated in the second region A2 can be dissipated at a short distance by the metal member 173 located directly above, while preventing the metal member 173 electrically connected to the first semiconductor layer 121.

In addition, the width W11 of the first metal layer 153*b* is greater than the width W21 of the first region A1 in a top plan view. In the light emitting element 100 described above, the heat dissipation area of the first metal layer 153*b* can be increased. Accordingly, the heat propagated to the first metal layer 153*b* can be efficiently dissipated.

In a top plan view, the width W31 of the metal member 173 is greater than the width W11 of the first metal layer 153*b*. In the light emitting element 100 described above, the heat-dissipating area of the metal member 173 can be increased. Accordingly, the heat propagated to the metal member 173 can be dissipated efficiently.

In the top plan view, the metal member 173 is located between the first terminal 171 and the second terminal 172. In the light emitting element 100 described above, heat generated inside the light emitting element 100 can be efficiently dissipated.

The first semiconductor layer 121 is the n-type semiconductor layer and the second semiconductor layer 123 is the p-type semiconductor layer. In the light emitting element 100 described above, heat generated by the current flowing from the second semiconductor layer 123 to the first semiconductor layer 121 can be dissipated efficiently.

The light emitting device 10 according to the present embodiment includes the light emitting element 100 and the base member 200. The base member 200 includes the first conductive member 221 electrically connected to the first terminal 171, the second electrically conductive member 222 electrically connected to the second terminal 172, and the third electrically conductive member 223 electrically connected to the metal member 173. In such a light emitting device 10, heat propagated from the first semiconductor layer 121 to the metal member 173 can be efficiently dissipated through the third electrically conductive member 223.

Variational Example

Figure 12:
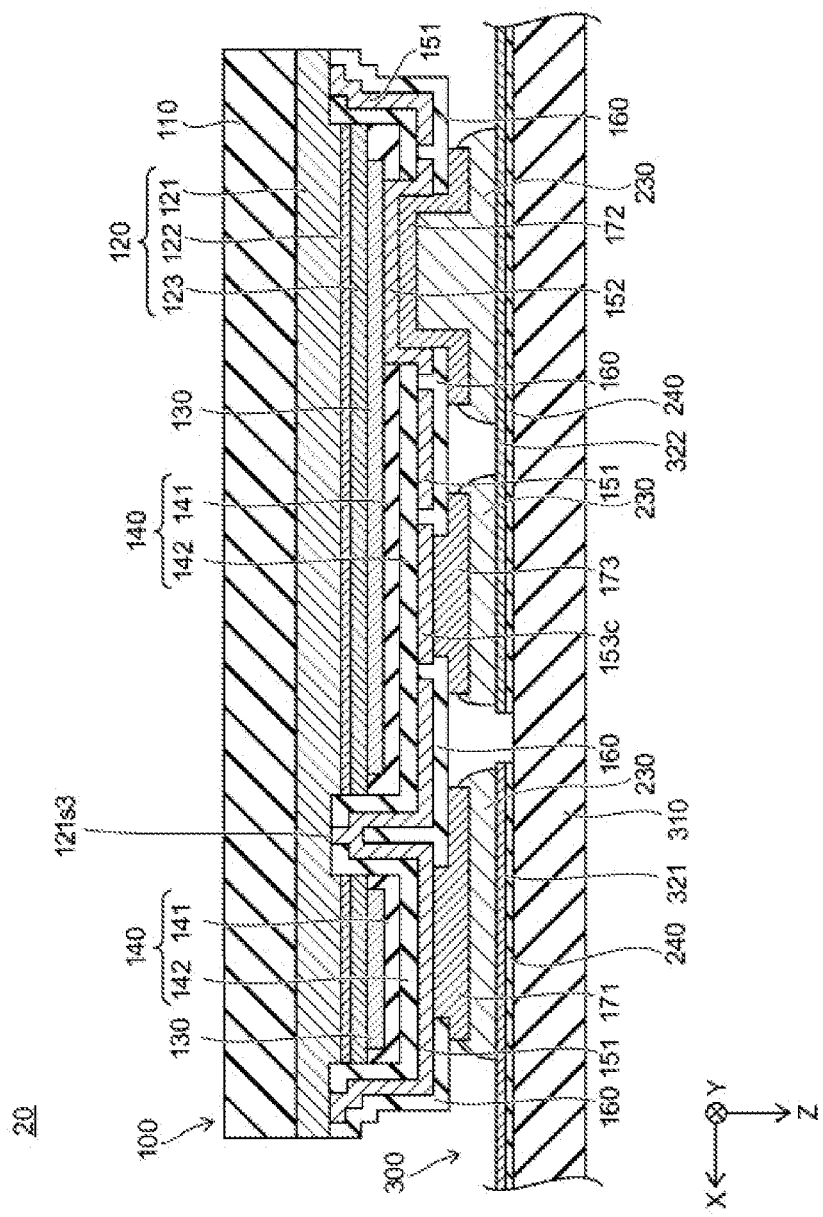
FIG. 12 is a schematic cross-sectional view of a light emitting device according to a variational example.

Next, a variational example of the embodiment described above will be illustrated. FIG. 12 is a schematic cross-sectional view of a light emitting device according to the present variational example. The light emitting device 20 according to the variational example differs from the light emitting device 10 according to the embodiment in the configuration of the base member 300. In the description below, the differences from the embodiment described above will be mainly described. The variational example 1 is similar to the embodiment described above except for the aspects described below.

The base member 300 has the support body 310, the first electrically conductive member 321, and the second electrically conductive member 322. The first electrically conductive member 321 and the second electrically conductive member 322 are disposed on the support member 310. The electrically insulating member 240 is located between the support member 310 and the first electrically conductive member 321 and between the support material 310 and the second electrically conductive member 322. The first electrically conductive member 321 is electrically connected to the first terminal 171 through the bonding member 230. The second electrically conductive member 322 is electrically connected to the second terminal 172 and the metal member 173 through the bonding member 230.

The light emitting device 20 includes a light emitting element 100 and a base body 51. The base member 300 has a first conductive material 321 electrically connected to terminal 171 and a second conductive material 322 electrically connected to terminal 172 and metal material 173. In such an optical emission device 20, heat transmitted from semiconductor layer 121 to metal member 173 can be efficiently dissipated by the second conductive material 322. In addition, the number of electrically conductive members disposed on the support member 310 can be reduced compared to that of the light emitting device 10 according to the embodiment described above to obtain a simpler structure.

The embodiment and the variational example described above illustrate the light emitting element having a plurality of metal layers, each of the metal layers located on the first electrically insulating film, and is electrically connected to the first electrically insulating film. However, alternatively, in the light emitting element, the metal layers may not be provided and the metal member may be disposed on and in contact with the first electrically insulating film.

It is to be understood that although the present invention has been described with regard to preferred embodiments thereof, various other embodiments and variants may occur to those skilled in the art that are within the scope and spirit of the invention, and such other embodiments and variants are intended to be covered by the following claims.

What is claimed is:
1. A light emitting element comprising:
a semiconductor layered structure comprising:
a first semiconductor layer of a first conductivity type, an active layer located on a portion of the first semiconductor layer, and
a second semiconductor layer of a second conductivity type located on the active layer,
wherein the first semiconductor layer comprises a first region and a second region located adjacent to each other and exposed from the active layer and the second semiconductor layer;
a first electrically insulating film covering surfaces of the semiconductor layered structure and defining a first opening in each of the first region and the second region, and defining a second opening in a portion above the second semiconductor layer;
a first electrode located on the first electrically insulating film and electrically connected to the first semiconductor layer through each first opening;
a second electrode electrically connected to the second semiconductor layer through the second opening;
a first terminal located on the first electrode and electrically connected to the first electrode;
a second terminal located on the second electrode and electrically connected to the second electrode;
a first metal layer located on a portion of the first electrically insulating film located over the second semiconductor layer, the first metal layer being electrically insulated from the first electrode and the second electrode; and
a metal member located over the portion of the first electrically insulating film located over the second semiconductor layer, the metal member being electrically insulated from the first terminal and the second terminal; wherein:
a portion of the metal member is located between the first region and the second region in a top plan view;
the first metal layer is located between the first region and the second region;
the metal member is electrically connected to the first metal layer; and
an outer edge of the first metal layer is located inward of an outer edge of the metal member in a top plan view.

2. A light emitting element comprising:
a semiconductor layered structure comprising:
a first semiconductor layer of a first conductivity type,
an active layer located on a portion of the first semiconductor layer, and
a second semiconductor layer of a second conductivity type located on the active layer,
wherein the first semiconductor layer comprises a first region and a second region located adjacent to each other and exposed from the active layer and the second semiconductor layer;
a first electrically insulating film covering surfaces of the semiconductor layered structure and defining a first opening in each of the first region and the second region, and defining a second opening in a portion above the second semiconductor layer;
a first electrode located on the first electrically insulating film and electrically connected to the first semiconductor layer through each first opening;
a second electrode electrically connected to the second semiconductor layer through the second opening;
a first terminal located on the first electrode and electrically connected to the first electrode;
a second terminal located on the second electrode and electrically connected to the second electrode;
a first metal layer located on a portion of the first electrically insulating film located over the second semiconductor layer, the first metal layer being electrically insulated from the first electrode and the second electrode; and
a metal member located over the portion of the first electrically insulating film located over the second semiconductor layer, the metal member being electrically insulated from the first terminal and the second terminal; wherein:
a portion of the metal member is located between the first region and the second region in a top plan view;
the first metal layer is located between the first region and the second region, and the metal member is electrically connected to the first metal layer;
the first electrode defines a first through-hole that is located between the first region and the second region in a top plan view and that exposes the first electrically insulating film;
the first semiconductor further comprises a third region adjacent to the second region and exposed from the active layer and the second semiconductor layer;
the first electrode further defines a second through-hole that is located between the second region and the third region and that exposes the first electrically insulating film;
a second metal layer electrically insulated from the first electrode and the second electrode is located in the second through-hole;
the second region is located between the first metal layer and the second metal layer in a top plan view; and
the metal member is electrically connected to the first metal layer and the second metal layer.

3. A light emitting element comprising:
a semiconductor layered structure comprising:
a first semiconductor layer of a first conductivity type,
an active layer located on a portion of the first semiconductor layer, and
a second semiconductor layer of a second conductivity type located on the active layer,
wherein the first semiconductor layer comprises a first region and a second region located adjacent to each other and exposed from the active layer and the second semiconductor layer;
a first electrically insulating film covering surfaces of the semiconductor layered structure and defining a first opening in each of the first region and the second region, and defining a second opening in a portion above the second semiconductor layer;
a first electrode located on the first electrically insulating film and electrically connected to the first semiconductor layer through each first opening;
a second electrode electrically connected to the second semiconductor layer through the second opening;
a first terminal located on the first electrode and electrically connected to the first electrode;
a second terminal located on the second electrode and electrically connected to the second electrode;
a first metal layer located on a portion of the first electrically insulating film located over the second semiconductor layer, the first metal layer being electrically insulated from the first electrode and the second electrode; and
a metal member located over the portion of the first electrically insulating film located over the second semiconductor layer, the metal member being electrically insulated from the first terminal and the second terminal; wherein:

a portion of the metal member is located between the first region and the second region in a top plan view;

the first metal layer is located between the first region and the second region, and the metal member is electrically connected to the first metal layer;

the first electrode defines a first through-hole that is located between the first region and the second region in a top plan view and that exposes the first electrically insulating film, and the first metal layer is located in the first through-hole;

the first semiconductor further comprises a third region adjacent to the second region and exposed from the active layer and the second semiconductor layer;

the first electrode further defines a second through hole that is located between the second region and the third region and that exposes the first electrically insulating film;

a second metal layer electrically insulated from the first electrode and the second electrode is located in the second through-hole;

the second region is located between the first metal layer and the second metal layer in a top plan view; and the metal member is electrically connected to the first metal layer and the second metal layer.

4. The light emitting element according to claim 2, wherein a portion of the metal member is located overlapping the first region in a top plan view.

5. The light emitting element according to claim 2, further comprising:

a second electrically insulating film covering a portion of the first electrode, a portion of the second electrode, a portion of the first metal layer, and a portion of the second metal layer, and defining a third opening that exposes another portion of the first electrode, a fourth opening that exposes another portion of the second electrode, a fifth opening that exposes another portion of the first metal layer, and a sixth opening that exposes another portion of the second metal layer; wherein:

the first terminal is electrically connected to the first electrode through the third opening, the second terminal is electrically connected to the second electrode through the fourth opening, and the metal member is electrically connected to the first metal layer through the fifth opening and electrically connected to the second metal layer through the sixth opening.

6. The light emitting element according to claim 3, further comprising:

a second electrically insulating film covering a portion of the first electrode, a portion of the second electrode, a portion of the first metal layer, and a portion of the second metal layer, and defining a third opening that exposes another portion of the first electrode, a fourth opening that exposes another portion of the second electrode, a fifth opening that exposes another portion of the first metal layer, and a sixth opening that exposes another portion of the second metal layer; wherein:

the first terminal is electrically connected to the first electrode through the third opening;

the second terminal is electrically connected to the second electrode through the fourth opening; and the metal member is electrically connected to the first metal layer through the fifth opening and electrically connected to the second metal layer through the sixth opening.

7. The light emitting element according to claim 5, wherein the metal member covers the second region via the second electrically insulating film.

8. The light emitting element according to claim 6, wherein the metal member covers the second region via the second electrically insulating film.

9. The light emitting element according to claim 2, wherein a width of the first metal layer is greater than a width of the first region in a top plan view.

10. The light emitting element according to claim 3, wherein a width of the first metal layer is greater than a width of the first region in a top plan view.

11. The light emitting element according to claim 2, wherein a width of the metal member is greater than a width of the first metal layer in a top plan view.

12. The light emitting element according to claim 3, wherein a width of the metal member is greater than a width of the first metal layer in a top plan view.

13. The light emitting element according to claim 2, wherein the metal member is located between the first terminal and the second terminal in a top plan view.

14. The light emitting element according to claim 3, wherein the metal member is located between the first terminal and the second terminal in a top plan view.

15. The light emitting element according to claim 2, wherein the first semiconductor layer is an n-type semiconductor layer, and the second semiconductor layer is a p-type semiconductor layer.

16. A light emitting device comprising:
the light emitting element according to claim 2; and
a base member comprising:
a first electrically conductive member electrically connected to the first terminal,
a second electrically conductive member electrically connected to the second terminal, and
a third electrically conductive member electrically connected to the metal member.

17. A light emitting device comprising:
the light emitting element according to claim 2; and
a base member comprising:
a first electrically conductive member electrically connected to the first terminal, and
a second electrically conductive member electrically connected to the second terminal and the metal member.

* * * * *